United States Patent
Lee et al.

(10) Patent No.: US 6,214,655 B1
(45) Date of Patent: Apr. 10, 2001

(54) AMORPHOUS SILICON DISPOSABLE SPACER TO REDUCE MASK COUNT IN CMOS TRANSISTOR FORMATION

(75) Inventors: Raymond T. Lee, Sunnyvale; Zicheng Gary Ling, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/277,161

(22) Filed: Mar. 26, 1999

(51) Int. Cl.[7] ................................................. H01L 21/8238
(52) U.S. Cl. ......................... 438/199; 438/304; 438/305; 438/306; 438/307
(58) Field of Search ..................... 438/304–307, 438/592, 267, 268, 184, 194, 199

(56) References Cited

U.S. PATENT DOCUMENTS

| | | | |
|---|---|---|---|
| 5,610,088 | * 3/1997 | Chang et al. | 438/306 |
| 5,736,466 | * 4/1998 | Wu | 438/305 |
| 5,804,499 | * 9/1998 | Dehm et al. | 438/592 |
| 5,946,581 | * 8/1999 | Garding et al. | 438/307 |

OTHER PUBLICATIONS

K. Noda et al., "A 2.9 μm² Embedded SRAM Cell with Co–Salicide Direct–Strap Technology for 0.18 μm High Performance CMOS Logic", *IEDM Technical Digest*, Dec., 1997, pp. 847–850.

* cited by examiner

*Primary Examiner*—David Nelms
*Assistant Examiner*—Dung A. Le (57) ABSTRACT

Semiconductor devices of different conductivity types are formed on a semiconductor substrate using a minimal number of critical masks. Embodiments include forming conductive gates on the main surface of the semiconductor substrate, and disposable amorphous silicon spacers on the sidewalls of the gates. A photoresist mask is then formed on gates and portions of the main surface intended to be implanted with impurities of a first conductivity type. Moderate or heavy source/drain implants of a second impurity type are then formed in the substrate, the disposable spacers on the unmasked gates are then removed, and lightly or moderately doped source/drain extension implants of the second impurity type are formed in the substrate. The first mask is then removed and a second photoresist mask is formed on the previously uncovered gates and implanted portions of the main surface. Moderate or heavy source/drain implants with impurities of the first conductivity type are then formed, the remaining disposable spacers are removed, and lightly or moderately doped source/drain extension implants of the first conductivity type formed. By using disposable spacers, the critical masking steps for source/drain ion implantation can be reduced to two, thereby reducing production costs and increasing manufacturing throughput.

17 Claims, 6 Drawing Sheets

AMORPHOUS SILICON DISPOSABLE SPACER TO REDUCE MASK COUNT IN CMOS TRANSISTOR FORMATION

RELATED APPLICATIONS

This application contains subject matter related to subject matter disclosed in copending U.S. patent application Ser. No. 09/305,098, filed on May 5, 1999, U.S. patent application Ser. No. 09/276,725, filed on Mar. 26, 1999, U.S. Pat. No. 6,103,563, filed on Mar. 17, 1999 and U.S. patent application Ser. No. 09/268,713, filed on Mar. 17, 1999.

FIELD OF THE INVENTION

The present invention relates to a method of manufacturing a semiconductor device on a semiconductor substrate. The invention has particular applicability in manufacturing a plurality of semiconductor devices of different conductivity types on a single substrate.

BACKGROUND ART

Metal oxide semiconductor (MOS) devices typically comprise a pair of ion implanted source/drain regions in a semiconductor substrate, a channel region separating the source/drain regions, and a thin gate oxide and a conductive gate comprising polysilicon or other conductive material formed above the channel region. In a typical integrated circuit, a plurality of MOS devices of different conductivity types, such as n-type and p-type, are formed on a common substrate.

Figure 1A:
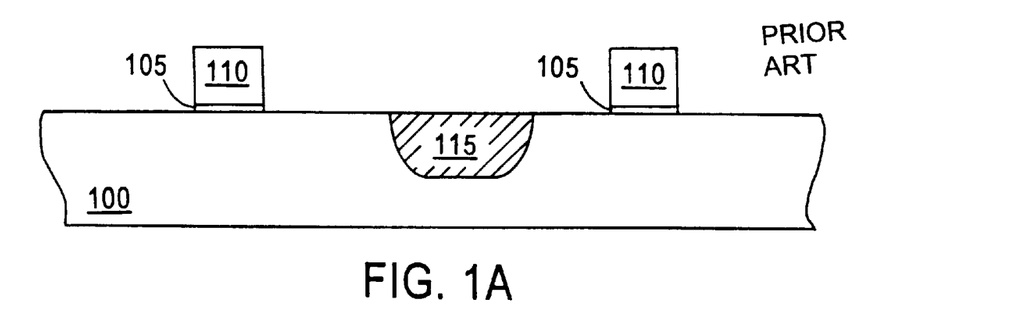
FIGS. 1A–1G schematically illustrate sequential phases of a conventional method of forming MOS semiconductor devices.
Figure 1B:
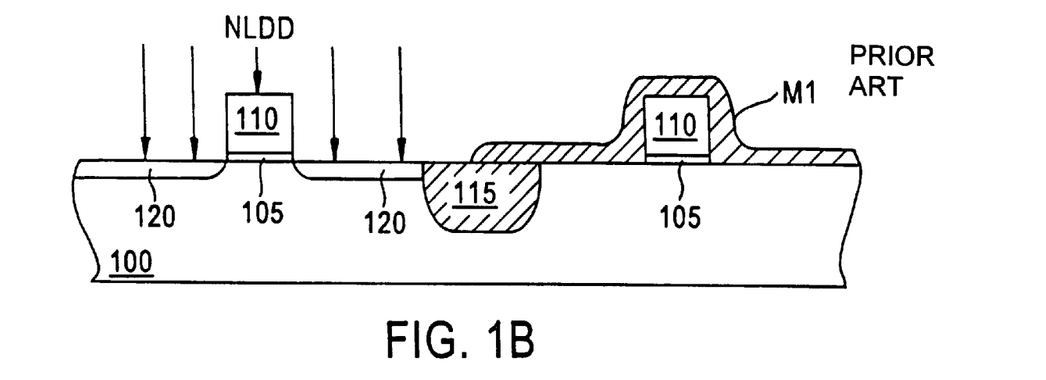
Figure 1C:
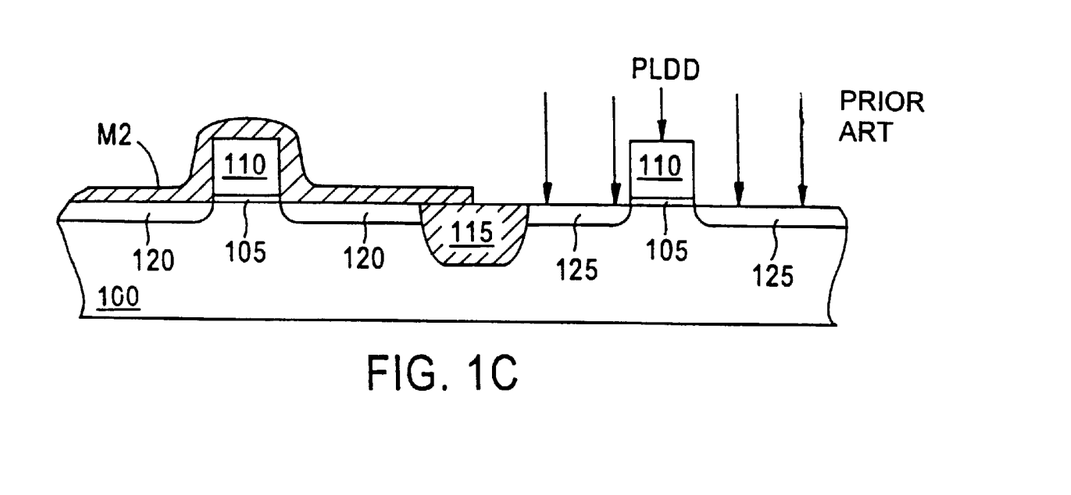

A traditional approach to forming MOS devices of different conductivity types on a single substrate is illustrated in FIGS. 1A–1G. As shown in FIG. 1A, field oxide areas 115 are formed, as by local oxidation of silicon (LOCOS) or shallow trench isolation (STI), in semiconductor substrate 100, then a thin gate oxide 105 is thermally grown, and conductive gates 110, such as polysilicon, are formed. A photoresist mask M1 is thereafter formed on the areas to be subsequently implanted with p-type impurities, and substrate 100 is implanted, as by ion implantation, with n-type impurities NLDD to form lightly or moderately doped regions 120, also called "shallow source/drain extensions" (see FIG. 1B). Adverting to FIG. 1C, mask M1 is then removed, and the areas previously implanted with impurities NLDD are masked with photoresist mask M2. Substrate 100 is thereafter implanted, as by ion implantation, with p-type impurities PLDD to form lightly or moderately doped regions 125.

Figure 1D:
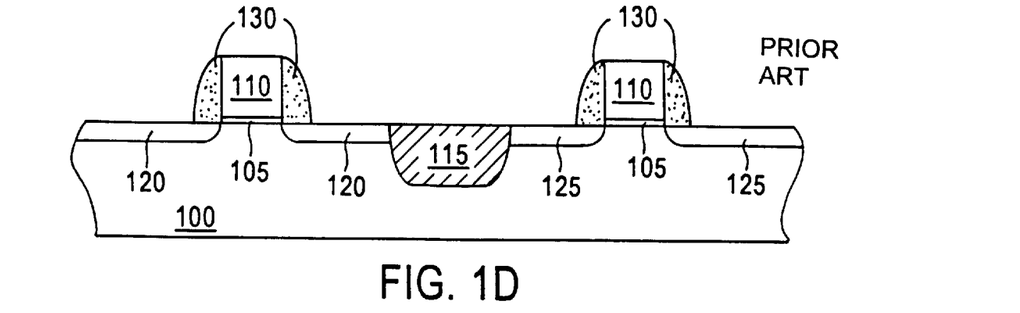
Figure 1E:
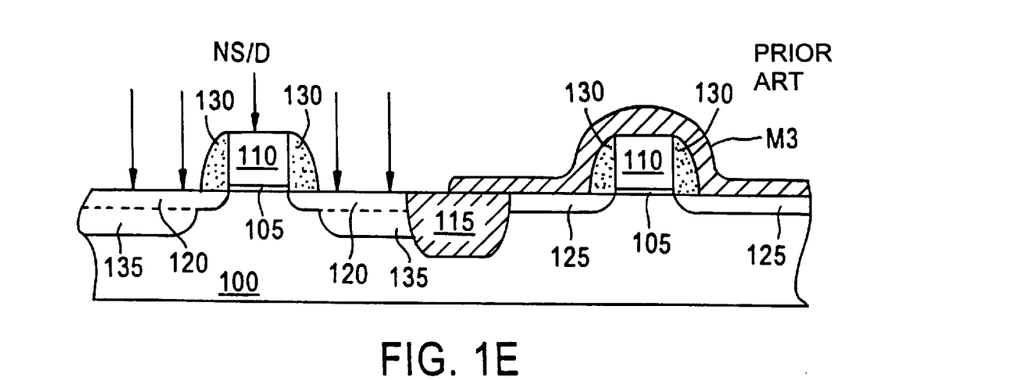
Figure 1F:
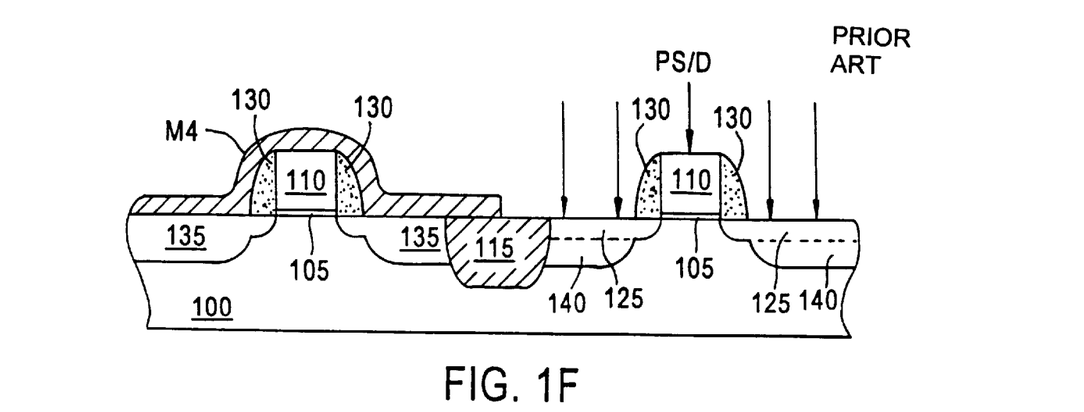

Next, as shown in FIG. 1D, sidewall spacers 130 are formed on the side surfaces of the gates 110, as by depositing a blanket layer of a dielectric material, such as silicon nitride, and anisotropically etching. A photoresist mask M3 is thereafter formed on the regions implanted with p-type impurities (see FIG. 1E), and substrate 100 is implanted, as by ion implantation, with n-type impurities NS/D to form source/drain regions 135, which include lightly or moderately doped regions 120. Adverting to FIG. 1F, mask M3 is then removed, and the areas previously implanted with impurities NS/D are masked with photoresist mask M4. Substrate 100 is thereafter implanted, as by ion implantation, with p-type impurities PS/D to form source/drain regions 140. Mask M4 is then removed, leaving the structure shown in FIG. 1G.

Figure 1G:
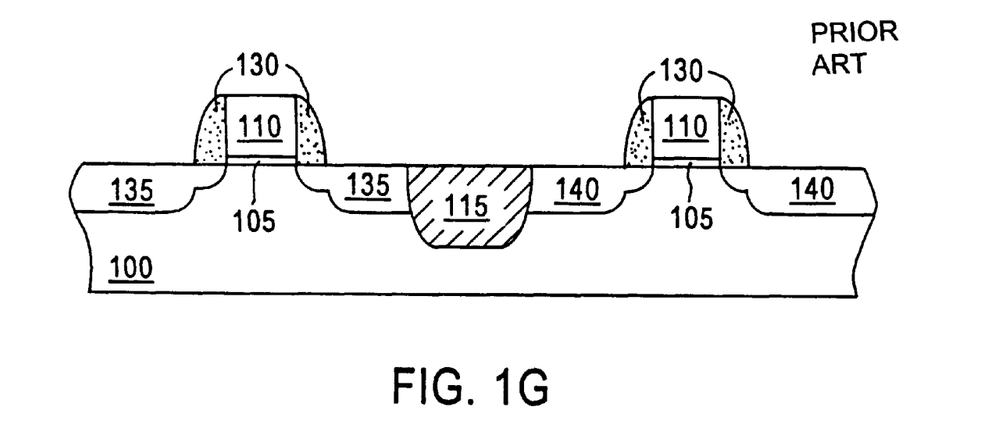

Source/drain implants NS/D, PS/D are typically implanted at a higher energy and dosage than lightly or moderately doped implants NLDD, PLDD, so source/drain implants NS/D, PS/D penetrate deeper into substrate 100 than lightly or moderately doped implants NLDD, PLDD. Additionally, sidewall spacers 130 prevent heavy source/drain implants NS/D, PS/D from entering substrate 100 adjacent to or under gates 110 to obtain the desired device performance characteristics. Thus, source/drain regions 135, 140 have a step corresponding to spacer 130.

Disadvantageously, the above-described methodology employs four photoresist masks (M1–M4), each of which requires the steps of spinning on the photoresist, exposing it with a stepper, developing the photoresist, and stripping off the mask after ion implantation. Each of these steps adds to the cost of the semiconductor device and decreases manufacturing throughput, and also subjects the device to additional handling, thereby increasing the likelihood of defects.

Moreover, masks M1–M4 are all "critical masks"; i.e., extremely complex and difficult to design and use. The large number of fine features required to form the masks challenge the capabilities of the photolithographic process necessary to implement them, thereby increasing manufacturing costs and reducing production throughput. As design rules are reduced to 0.18 $\mu$m and under, e.g., 0.15 $\mu$m and under, to meet increasing demands for miniaturization and higher circuit density, shrinking feature sizes cause masks such as M1–M4 to become even more difficult and costly to design and use.

Accordingly, there exists a need for a method of manufacturing MOS semiconductor devices with a reduced number of critical masks, thereby reducing manufacturing costs and increasing production throughput.

SUMMARY OF THE INVENTION

An advantage of the present invention is a method of forming a plurality of MOS devices of different conductivity types on a common substrate using a minimal number of critical masks, thereby reducing manufacturing costs and increasing production throughput.

Additional advantages and other features of the present invention will be set forth in part in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, which method comprises forming first and second conductive gates on a main surface of a semiconductor substrate with a gate dielectric layer therebetween; forming amorphous silicon sidewall spacers on side surfaces of the gates and extending onto the main surface; forming a first mask on the first gate and extending onto a first portion of the main surface; ion implanting impurities, using the second gate and sidewall spacers thereon as a mask, to form first moderate or heavy source/drain implants; removing the amorphous silicon sidewall spacers from the side surfaces of the second gate; ion implanting impurities, using the second gate as a mask, to form first lightly or moderately doped source/drain extension implants; removing the first mask; forming a second mask on the second gate and extending onto a second portion of the main surface; ion implanting impurities, using the first gate and sidewall spacers thereon as a mask, to form moderate or heavy second source/drain implants; removing the amorphous silicon sidewall spacers from the side surfaces of the first gate; and ion implanting impurities, using the first gate as a mask, to form second lightly or moderately doped source/drain extension implants.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DESCRIPTION OF THE INVENTION

Conventional methodologies for manufacturing MOS semiconductor devices employ an unduly large number of photoresist masking steps, which increases the cost of the finished device and reduces manufacturing yield. The present invention addresses and solves these problems stemming from conventional complex manufacturing processes.

Embodiments of the present invention include forming conductive gates on the main surface of a semiconductor substrate, and disposable amorphous silicon sidewall spacers on the side surfaces of the gates. As used throughout the present disclosure and claims, the term "substrate" denotes a semiconductor substrate or an epitaxial layer formed on the semiconductor substrate. A mask is then formed on some of the gates, the mask extending onto the main surface adjacent to those gates to cover intended source/drain regions to be implanted with impurities of a first conductivity type.

Moderate or heavy source/drain implants of a second impurity type are thereafter formed in the substrate, as by ion implantation, adjacent to the unmasked gates. The disposable sidewall spacers on the unmasked gates are then removed, and lightly or moderately doped shallow source/drain extension implants of the second impurity type are formed in the substrate, as by ion implantation. The first mask is then removed and a second photoresist mask is formed on the previously uncovered gates, the mask extending onto the main surface to cover the previous source/drain implants. Moderate or heavy source/drain implants with impurities of the first conductivity type are then formed, the remaining disposable sidewall spacers removed, and lightly or moderately doped shallow source/drain extension implants of the first conductivity type formed. By reversing the lightly or moderately doped shallow source/drain extension and moderate or heavy source/drain implantation sequence of conventional MOS formation methodologies and employing disposable sidewall spacers, the critical masking steps are reduced from four to two, thereby significantly reducing production cycle time, handling of the devices during processing, and the potential for defects.

Figure 2A:
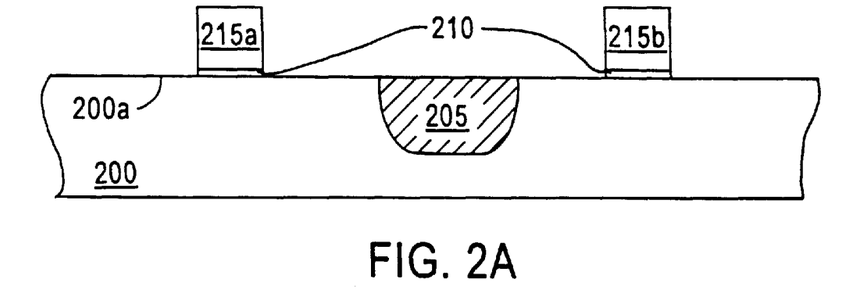
FIGS. 2A–2H schematically illustrate sequential phases of a method in accordance with an embodiment of the present invention.

An embodiment of the present invention is illustrated in FIGS. 2A–2H. Referring to FIG. 2A, field oxide regions 205 are formed in a semiconductor substrate 200, as by STI or LOCOS. A gate oxide layer 210 is formed, as by thermal oxidation, on main surface 200a of substrate 200, followed by conductive gates 215a, 215b, such as by deposition of a polysilicon layer, masking of the polysilicon layer, and etching. Gates 215a will be associated with source/drain regions subsequently formed by implantation of n-type impurities, and gates 215b will be associated with source/drain regions subsequently formed by implantation of p-type impurities.

Figure 2B:
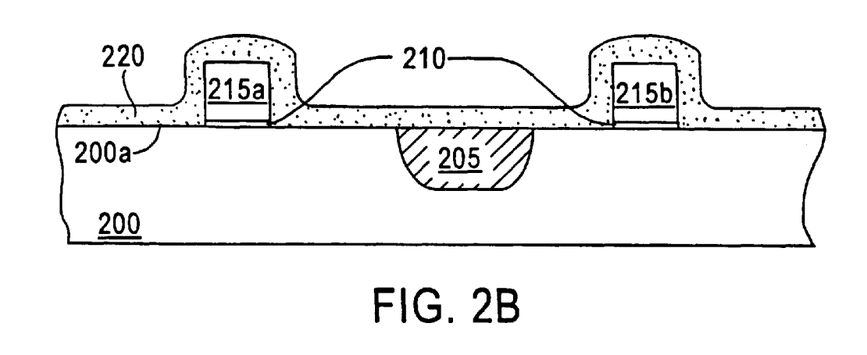

As shown in FIG. 2B, a layer of amorphous silicon 220 is formed, such as a conformal layer deposited by low pressure chemical vapor deposition (LPCVD) or rapid thermal chemical vapor deposition (RTCVD), to a suitable thickness; e.g., a thickness of about 200 Å to about 900 Å. Amorphous silicon layer 220 is then anisotropically etched to form disposable sidewall spacers 225a, 225b on the sidewalls of gates 215a, 215b, respectively. After the etching procedure, sidewall spacers 225a, 225b extend onto main surface 200a about 200 Å to about 800 Å, depending on the thickness of amorphous silicon layer 220 (see FIG. 2C).

Figure 2C:
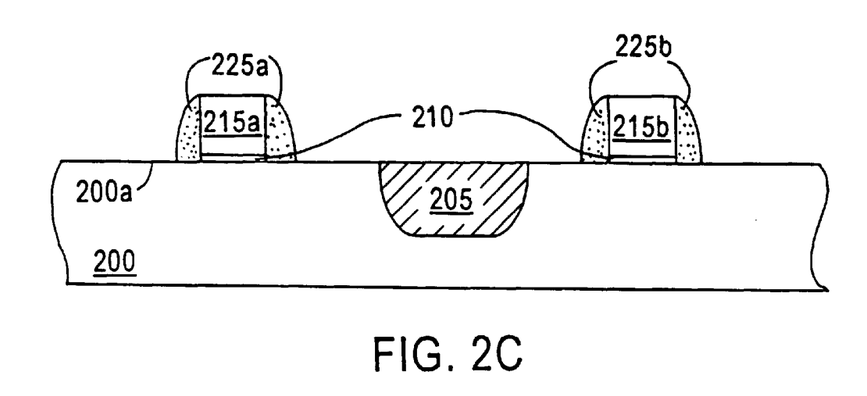

In copending related U.S. Pat. No. 6,103,563, the use of silicon nitride as a material for disposable sidewall spacers 225, 225b is disclosed. However, amorphous silicon is advantageously employed in the present methodology as a material for sidewall spacers 225a, 225b because it is more easily etched without damage to previously formed oxide features (such as field oxide 205) or to the substrate silicon than silicon nitride. Thus, sidewall spacers 225a, 225b are more readily formed from an amorphous silicon layer than from the silicon nitride layer of copending U.S. Pat. No. 610,563. On the other hand, sidewall spacers 225a, 225b formed of amorphous silicon according to the present invention are more difficult to remove from polysilicon gates 215a, 215b than silicon nitride spacers; that is, care must be exercised to avoid damaging gates 215a, 215b during subsequent etching to remove sidewall spacers 225a, 225b.

Figure 2D:
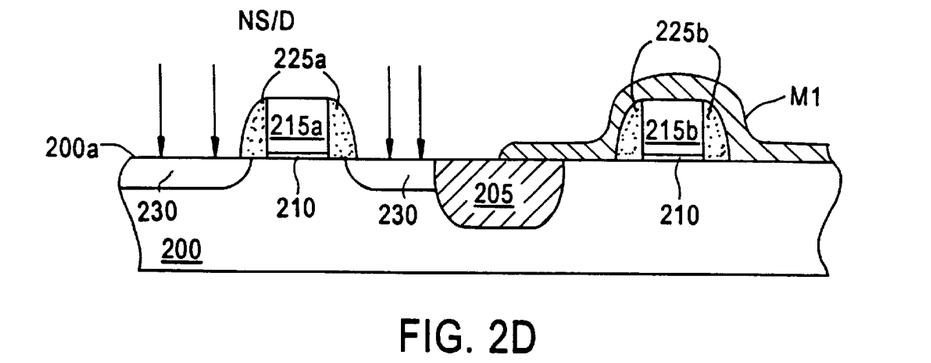
Figure 2E:
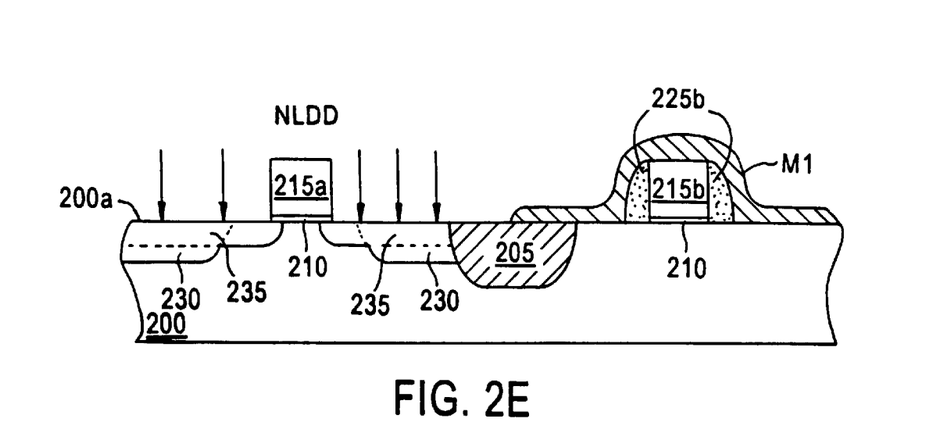
Figure 2F:
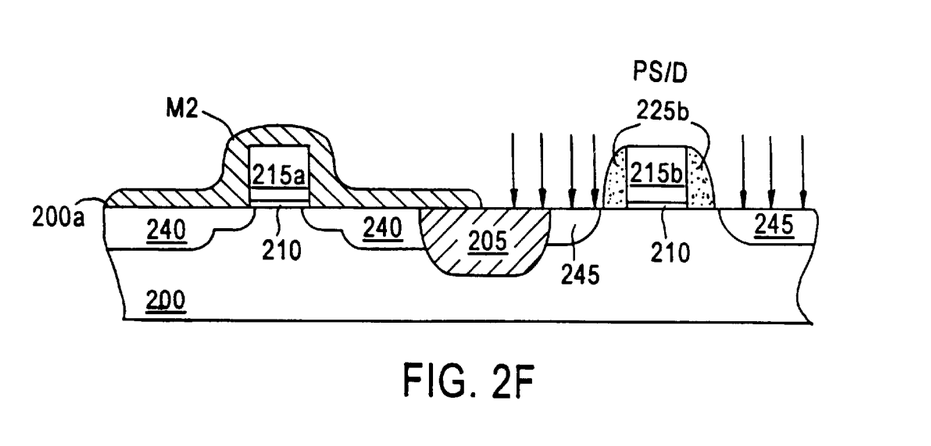
Figure 2G:
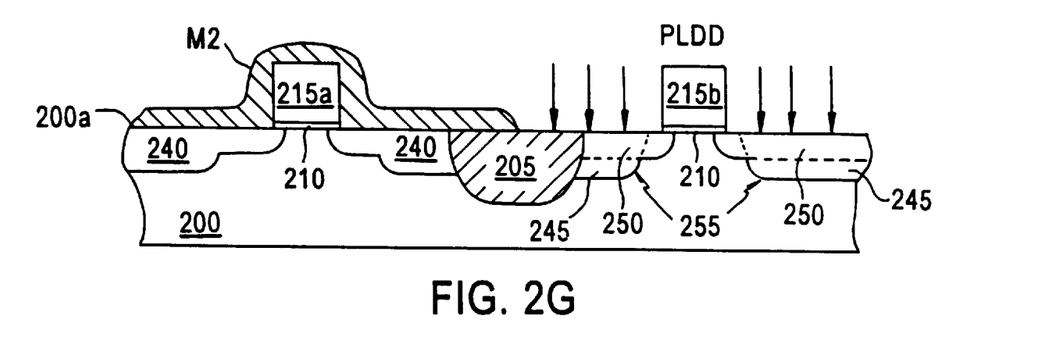

Next, referring to FIG. 2D, a photoresist mask M1 is formed on gates 215b and extending onto main surface 200a to cover portions of main surface 200a corresponding to subsequently formed p-type moderate or heavy source/drain implants. N-type impurities NS/D, such as arsenic, phosphorus and/or other materials to enhance transistor characteristics, are then implanted, as by ion implantation, in substrate 200 to form n-type moderate or heavy source/drain implants 230. Adverting to FIG. 2E, sidewall spacers 225a are thereafter removed, as by wet or dry etching selective to removing amorphous silicon (i.e., not reactive with the photoresist of mask M1). N-type impurities NLDD, such as arsenic, phosphorus and/or other materials to enhance transistor characteristics, are then implanted, as by ion implantation, in substrate 200 to form n-type lightly or moderately doped shallow source/drain extension implants 235, which form n-type stepped source/drain implants 240 in conjunction with n-type moderate or heavy source/drain implants 230 (see FIG. 2F). As in conventional MOS processing, impurities NLDD are implanted at a dosage about 1–2 orders of magnitude lower than that of impurities NS/D, and at a substantially lower energy; e.g., less than about 10 keV versus about 30 keV for NS/D.

Referring again to FIG. 2F, mask M1 is thereafter removed, and photoresist mask M2 is formed on gates 215a and extending onto main surface 200a to cover n-type stepped source/drain implants 240. P-type impurities PS/D, such as boron and/or other materials to enhance transistor characteristics, are then implanted, as by ion implantation, in substrate 200 to form p-type moderate to heavy source/drain implants 245. Adverting to FIG. 2G, sidewall spacers 225b are thereafter removed, as by wet or dry etching. P-type impurities PLDD, such as boron and/or other materials to enhance transistor characteristics, are then implanted, as by ion implantation, in substrate 200 to form p-type lightly or moderately doped shallow source/drain extension implants 250 which form p-type stepped source/drain implants 255 in conjunction with p-type moderate or heavy source/drain implants 245 (see FIG. 2H). As in conventional MOS processing, impurities PLDD are implanted at a dosage about 1–2 orders of magnitude lower than that of impurities PS/D, and at a substantially lower energy; e.g., less than about 10 keV versus about 20 keV for PS/D.

Figure 2H:
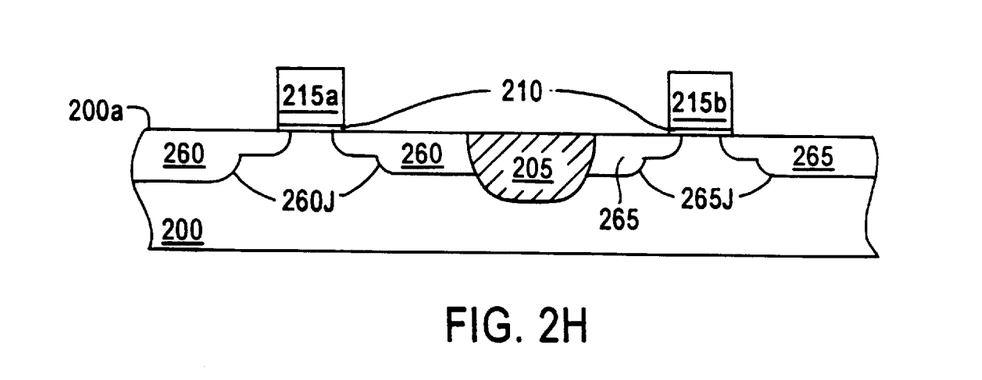

After removing mask M2, as shown in FIG. 2H, substrate 200 is heated to diffuse and electrically activate implanted impurities NLDD, PLDD, NS/D and PS/D in stepped source/drain implants 240 and 255 to form source/drain regions 260, 265, as by rapid thermal annealing at a temperature of about 900° C. to about 1100° C. for less than about 30 seconds. Preferably, NS/D and NLDD implants are performed at a higher energy than the PS/D and PLDD implants, resulting in the stepped n-type source/drain implants 240 being deeper than p-type stepped source/drain implants 255 prior to the heating step. N-type impurities diffuse less quickly when heated than p-type impurities. Thus, by employing higher energy to form n-type stepped source/drain implants 240 deeper than p-type stepped source/drain implants 255, the final depths of both n-type and p-type junctions 260J, 265J are optimized after the heating step, resulting in improved device performance.

In another embodiment of the invention, a first heating step is performed, such as rapid thermal annealing at a temperature of about 900° C. to about 1100° C. for less than about 30 seconds, after formation of n-type stepped source/drain implants 240 and removal of mask M1, to tailor the depth of junctions 260J. A second heating step is then performed after formation of p-type stepped source/drain implants 255 and removal of mask M2, such as rapid thermal annealing at a temperature of about 900° C. to about 1100° C. for less than about 30 seconds. As explained above, N-type impurities diffuse less quickly when heated than p-type impurities. Thus, by employing a two-step heating process to apply heat to n-type stepped source/drain implants 240 for a longer period of time than p-type stepped source/drain implants 255 to form source/drain regions 260, 265, respectively, the depths of both n-type and p-type junctions 260J, 265J are optimized, resulting in improved device performance.

Subsequent processing steps include depositing a dielectric layer, such as silicon dioxide, on main surface 200a and gates 215a, 215b, anisotropically etching the oxide layer to form spacers on the sidewalls of gates 215a, 215b, and then conducting a silicidation process to form electrodes on gates 215a, 215b and on source/drain regions 240, 255. Alternatively, a dielectric layer can be deposited over main surface 200a and gates 215a, 215b, and contact holes to source/drain regions 260, 265 and gates 215a, 215b patterned.

Due to the use of disposable sidewall spacers 225a, 225b, the present methodology enables two implants (a moderate or heavy source/drain implant and a lightly or moderately doped shallow source/drain extension implant) to be performed with a single mask, thereby reducing the number of critical masks needed for the formation of a plurality of MOS transistors of different conductivity types from four to two. Thus, production costs are reduced, as well as production cycle time, the amount of handling to which the devices are subject during processing, and the potential for defects, resulting in improved manufacturability and yield. The present invention is applicable to the manufacture of various types of semiconductor devices, particularly high density semiconductor devices having a design rule of about $0.18\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:
    forming first and second conductive gates on a main surface of a semiconductor substrate with a gate dielectric layer therebetween;
    forming amorphous silicon sidewall spacers on side surfaces of the gates and extending onto the main surface;
    forming a first mask on the first gate and extending onto a first portion of the main surface;
    ion implanting impurities, using the second gate and sidewall spacers thereon as a mask, to form first moderate or heavy source/drain implants;
    removing the amorphous silicon sidewall spacers from the side surfaces of the second gate;
    ion implanting impurities, using the second gate as a mask, to form first lightly or moderately doped source/drain extension implants;
    removing the first mask;
    forming a second mask on the second gate and extending onto a second portion of the main surface;
    ion implanting impurities, using the first gate and sidewall spacers thereon as a mask, to form moderate or heavy second source/drain implants;
    removing the amorphous silicon sidewall spacers from the side surfaces of the first gate; and
    ion implanting impurities, using the first gate as a mask, to form second lightly or moderately doped source/drain extension implants.

2. The method according to claim 1, comprising:
    depositing a blanket layer of amorphous silicon on the main surface; and
    anisotropically etching the layer of amorphous silicon to form the amorphous silicon sidewall spacers.

3. The method according to claim 2, comprising depositing the amorphous silicon layer to a thickness of about 200 Å to about 900 Å.

4. The method according to claim 3, comprising forming the amorphous silicon sidewall spacers to extend onto the main surface a distance of about 200 Å to about 800 Å.

5. The method according to claim 2, comprising depositing the amorphous silicon layer by LPCVD.

6. The method according to claim 2, comprising depositing the amorphous silicon layer by RTCVD.

7. The method according to claim 1, comprising:
   implanting impurities of a first conductivity type to form the first moderate or heavy source/drain and first lightly or moderately doped source/drain extension implants; and
   implanting impurities of a second conductivity type to form the second moderate or heavy source/drain and second lightly or moderately doped source/drain extension implants.

8. The method according to claim 7, comprising:
   implanting n-type impurities to form the first moderate or heavy source/drain and first lightly or moderately doped source/drain extension implants; and
   implanting p-type impurities to form the second moderate or heavy source/drain and second lightly or moderately doped source/drain extension implants.

9. The method according to claim 8, comprising:
   heating to diffuse the first moderate or heavy source/drain and first lightly or moderately doped source/drain extension implants after removing the first mask; and
   heating to diffuse and electrically activate the first moderate or heavy source/drain implants, the first lightly or moderately doped source/drain extension implants, the second moderate or heavy source/drain implants and the second lightly or moderately doped source/drain extension implants after removing the second mask.

10. The method according to claim 9, wherein the heating steps include rapid thermal annealing at a temperature of about 900° C. to about 1100° C. for less than about 30 seconds.

11. The method according to claim 1, comprising heating to diffuse and electrically activate the first moderate or heavy source/drain implants, the first lightly or moderately doped source/drain extension implants, the second moderate or heavy source/drain implants and the second lightly or moderately doped source/drain extension implants after removing the second mask.

12. The method according to claim 11, comprising heating by rapid thermal annealing at a temperature of about 900° C. to about 1100° C. for less than about 30 seconds.

13. The method according to claim 11, comprising implanting the first moderate or heavy source/drain implants and first lightly or moderately doped source/drain extension implants at a higher energy than that employed for implanting the second moderate or heavy source/drain implants and the second lightly or moderately doped source/drain extension implants.

14. The method according to claim 1, wherein the first and second masks are photoresist masks.

15. The method according to claim 1, comprising etching to remove the amorphous silicon sidewall spacers.

16. The method according to claim 1, further comprising:
   removing the second mask; and
   depositing a dielectric layer on the main surface and the gates after removing the second mask.

17. The method according to claim 1, wherein the first portion of the main surface comprises that portion of the main surface corresponding to the second moderate or heavy source/drain implants, and the second portion of the main surface comprises that portion of the main surface corresponding to the first moderate or heavy source/drain implants.

* * * * *